(12) United States Patent
Hui et al.

(10) Patent No.: US 6,461,923 B1
(45) Date of Patent: Oct. 8, 2002

(54) SIDEWALL SPACER ETCH PROCESS FOR IMPROVED SILICIDE FORMATION

(75) Inventors: Angela T. Hui, Fremont, CA (US); Paul R. Besser, Austin, TX (US); Susan H. Chen, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/639,816

(22) Filed: Aug. 17, 2000

Related U.S. Application Data

(60) Provisional application No. 60/149,442, filed on Aug. 18, 1999.

(51) Int. Cl.[7] ............... H01L 21/336; H01L 21/3205; H01L 21/4763; H01L 21/44
(52) U.S. Cl. ............... 438/305; 438/586; 438/680
(58) Field of Search .................. 438/305, 586, 438/682

(56) References Cited

U.S. PATENT DOCUMENTS

| | | | |
|---|---|---|---|
| 4,760,033 A | * | 7/1988 | Mueller |
| 4,994,404 A | * | 2/1991 | Sheng et al. |
| 5,744,395 A | * | 4/1998 | Shue et al. |
| 5,872,047 A | * | 2/1999 | Lee et al. ............ 438/530 |
| 5,949,126 A | * | 9/1999 | Dawson et al. |
| 6,171,919 B1 | * | 1/2001 | Besser et al. ............ 438/305 |

* cited by examiner

Primary Examiner—John F. Niebling
Assistant Examiner—Ron Pompey

(57) ABSTRACT

Sub-micron dimensioned, ultra-shallow junction MOS and/ or CMOS transistor devices having reduced or minimal junction leakage are formed by a salicide process wherein silicon substrate surfaces intended to be subjected to ion implantation for source/drain formation are protected from damage resulting from reactive plasma etching of a blanket insulative layer for sidewall spacer formation by leaving a residual thickness of the insulative layer thereon. The residual layer is retained during ion implantation and removed prior to salicide processing to provide an undamaged surface for optimal contact formation thereon. Embodiments include anisotropically plasma etching a major amount of the thickness of the blanket insulative layer during a preselected interval for sidewall spacer formation and removing the residual thickness thereof after source/ drain implantation by etching with dilute aqueous HF.

20 Claims, 2 Drawing Sheets

SIDEWALL SPACER ETCH PROCESS FOR IMPROVED SILICIDE FORMATION

RELATED APPLICATIONS

This application claims priority from U.S. Provisional Application Ser. No. 60/149,442, filed Aug. 18, 1999, incorporated herein by reference.

FIELD OF THE INVENTION

The present invention relates to a method of manufacturing high-density integrated circuit semiconductor devices exhibit reliable, adherent, low resistance, accurately-aligned contacts to source, drain, and gate electrode region of active devices, such as MOS transistors formed in or on a semiconductor substrate, by utilizing self-aligned, refractory metal silicide ("salicide") processing methodology. The present invention has particular utility in manufacturing high-density integration semiconductor devices, including multi-level devices, with design rules of 0.18 $\mu$m and below, e.g., 0.15 $\mu$m and below.

BACKGROUND OF THE INVENTION

The escalating requirements for high density and performance associated with ultra-large scale integration (ULSI) devices necessitate design rules of 0.18 $\mu$m and below, such as 0.15 $\mu$m and below, with increased transistor and circuit speeds, high reliability, and increased manufacturing throughput. The reduction of design features, e.g., of source and drain regions, and gate electrodes of transistors formed in or on a common semiconductor substrate, challenges, the limitations of conventional contact and interconnection technology, including conventional photolithographic, etching, and deposition techniques.

Self-aligned techniques are conventionally employed for forming large-scale and ultra-small dimensioned integrated semiconductor devices. As device dimensions decrease into the deep sub-micron range, both vertically and laterally, many problems arise, especially those caused by an increase in sheet resistance of the contact areas to the source and drain regions and junction leakage as junction layer thickness decreases. To overcome this problem, the use of self-aligned, highly electrically conductive refractory metal silicides, i.e., salicides, has become commonplace in the manufacture of integrated circuit semiconductor devices comprising, e.g., MOS type transistors. Another technique employed in conjunction with refractory metal silicide technology is the use of lightly-doped source and drain extensions formed just at the edge of the gate region, while more heavily-doped source and drain regions, to which ohmic contact is to be provided, are laterally displaced away from the gate by provision of sidewall spacers on opposing sides of the gate electrode.

Salicide processing involves deposition of a metal that forms a compound with silicon, but does not react with silicon oxides, nitrides, or oxynitrides under normal processing conditions. Refractory metals commonly employed in salicide processing include platinum (Pt), titanium (Ti), nickel (Ni), and cobalt (Co), each of which forms very low resistivity phases with silicon (Si), e.g., $PtSi_2$, $TiSi_2$, NiSi and $CoSi_2$. In practice, the refractory metal is deposited in uniform thickness over all exposed upper surface features of a Si wafer, preferably by means of physical vapor deposition (PVD) from an ultra-pure sputtering target and an ultra-high vacuum, multi-chamber DC magnetron sputtering system. In MOS transistor formation, deposition is generally performed both after gate etch and after source/drain junction formation. In a less common variant, source/drain junction formation is effected subsequent to refractory metal layer deposition via dopant diffusion through the refractory metal layer into the underlying semiconductor. In either case, after deposition, the refractory metal layer blankets the top surface of the gate electrode, typically formed of heavily-doped polysilicon, the silicon oxide, nitride, or oxynitride sidewall spacers on the opposing side surfaces of the gate electrode, the silicon oxide isolation regions formed in the silicon substrate between adjacent active device regions, and the exposed surfaces of the substrate where the source and drain regions are formed or will be subsequently formed. As a result of thermal processing, e.g., a rapid thermal annealing process (RTA) performed in an inert atmosphere, the refractory metal reacts with underlying Si to form electrically conductive silicide layer portions on the top surface of the polysilicon gate electrode and on the exposed surfaces of the substrate where source and drain regions are or will be formed. Unreacted portions of the refractory metal layer, e.g., on the silicon oxide, nitride, or oxynitride sidewall spacers and the silicon oxide isolation regions, are then removed, as by a wet etching process selective to the metal silicide portions. In some instances, e.g., with Co, a first RTA step may be performed at a relatively lower temperature in order to form first-phase CoSi which is then subjected to a second RTA step performed at a relatively high temperature to convert the first-phase CoSi to second-phase, lower resistivity $CoSi_2$.

Illustrated in FIGS. 1(A)–1(E) are steps in a typical salicide process, illustratively $CoSi_2$, for manufacturing MOS transistors and CMOS devices according to the conventional art. The term "semiconductor substrate" as employed throughout the present disclosure and claims, denotes a Si-containing wafer, e.g., a monocrystalline Si wafer, or an epitaxial Si-containing layer formed on a semiconductor substrate comprising at least one region 1 of a first conductivity type. It will be appreciated that for P-MOS transistors, region 1 is n-type and for N-MOS transistors, region 1 is p-type. It is further understood that the substrate may comprise pluralities of n- and p-type regions arrayed in a desired pattern, as for example, in CMOS devices.

Referring more particularly to FIG. 1(A), reference numeral 1 indicates a region or portion of a Si-containing semiconductor substrate of a first conductivity type (p or n), fabricated as a MOS transistor precursor 2 for use in a salicide process scheme. Precursor 2 is processed, as by conventional techniques not described here in detail, in order to not unnecessarily obscure the primary significance of the following description. Precursor 2 comprises a plurality of, illustratively two, isolation regions 3 and 3' of a silicon oxide, e.g., shallow trench isolation (STI) regions, extending from the substrate surface 4 to a prescribed depth below the surface. A gate insulator layer 5, typically comprising a silicon oxide layer about 25–50 Å thick, is formed on substrate surface 4. Gate electrode 6, typically of heavily-doped polysilicon, is formed over a portion of silicon oxide gate insulator layer 5, and comprises opposing side surfaces 6', 6', and top surface 6". Blanket layer 7 of an insulative material, typically an oxide, nitride, or oxynitride of silicon, is then formed to cover all exposed portions of substrate surface 4 and the exposed surfaces of the various features formed thereon or therein, inter alia, the opposing side surfaces 6', 6' and top surface 6" of gate electrode 6 and the upper surface of STI regions 3, 3'. The thickness of blanket insulative layer 7 is selected so as to provide sidewall spacers, 7', 7' of desired width (see below) on each of the opposing side surfaces 6', 6' of the gate electrode 6.

Referring now to FIG. 1(B), MOS precursor structure 2 is then subjected to an anisotropic etching process, as by reactive plasma etching utilizing a fluorocarbon- or fluorohydrocarbon-based plasma comprising argon (Ar) and at least one reactive gaseous species selected from $CF_4$ and $CHF_3$, for selectively removing the laterally extending portions of insulative layer 7 and underlying portions of the gate oxide layer 5, whereby sidewall spacers 7', 7' of desired width profile are formed along the opposing side surfaces 6', 6' of gate electrode 6. According to conventional processing methodology, the entire thickness of the selected portions of insulative layer 7 and any underlying portions of gate oxide layer 5 are removed during the plasma etching process. Endpoint monitoring of the plasma etching process is typically achieved spectroscopically, as by loss of characteristic oxygen peak of the plasma atmosphere upon complete consumption of the blanket insulative layer 7 and/or the gate oxide layer 5.

Adverting to FIG. 1(C), moderately- to heavily-doped source and drain junction regions 8 and 9 of conductivity type opposite that of the substrate (or epitaxial layer on a suitable substrate) are then formed in substrate region 1, as by conventional ion implantation (the details of which are omitted for brevity), with sidewall spacers 7', 7' acting as implantation masks and setting the lateral displacement length of moderately- to heavily-doped regions 8 and 9 from the respective proximal edges 6', 6' of gate electrode 6.

With reference to FIG. 1(D), in a following step, the thus-formed structure with implanted moderately- to heavily-doped source/drain regions 8, 9 is subjected to a conventional high temperature treatment, typically rapid thermal annealing (RTA), for effecting activation and diffusion of the implanted dopant species, thereby also forming lightly-doped, shallower depth source/drain extension regions, 8', 9' laterally extending from the respective proximal edges of the moderately- to heavily-doped source/drain regions 8, 9 to just beneath the neighboring edge 6' of gate electrode 6. It should be recognized, however, that the above-described method for forming source/drain regions including lightly-doped extensions is merely illustrative. Equivalently performing source/drain structures may be formed by alternative process schemes, e.g., by first lightly implanting substrate 1 with dopant impurities of second conductivity type prior to sidewall spacer formation, with the implanted regions extending to just beneath the respective edges of the gate electrode, followed by selective heavy implantation of the lightly-doped implant (e.g., after sidewall spacer formation) to form heavily-doped source/drain regions appropriately spaced from the gate electrode by the light-doped (extension) implants.

With continued reference to FIG. 1(D), a layer 10 of a refractory metal metal, typically Pt, Co, Ni, or Ti, is formed, as by DC sputtering, to cover the exposed upper surfaces of precursor structure 2. Following refractory metal layer 10 deposition, a thermal treatment, typically rapid thermal annealing (RTA), is performed at a temperature and for a time sufficient to convert metal layer 10 to the corresponding electrically conductive metal silicide, e.g., $PtSi_2$, $CoSi_2$, NiSi, or $TiSi_2$. Since the refractory metal silicide forms only where metal layer 10 is in contact with the underlying silicon, the unreacted portions of metal layer 10 formed over the silicon oxide isolation regions 3 and 3' and silicon nitride sidewall spacers 7', 7' are selectively removed, as by a wet etch process.

Referring now to FIG. 1(E), the resulting structure after reaction and removal of unreacted metal comprises metal silicide layer portions 11 and 12, 12' respectively formed over gate electrode 6 and heavily-doped source and drain regions 8 and 9. Further processing may include, inter alia, formation of metal contact and dieletric insulator layers. However, as is evident from FIG. 1(E), the lower surfaces of the metal silicide layer 12, 12' portions formed by the above-described methodology are rough at the silicide-silicon interfaces, disadvantageously resulting in penetration of the underlying silicon substrate 1 by the silicide. Such penetration or "spiking" of the silicon in the region below the source and drain junction regions 8 and 9, illustratively shown at 13 and 13', can cause local shorting of the junctions, thereby resulting in junction leakage. The effect of junction penetration or spiking is greatest with metals such as Co, which have relatively high silicon consumption ratios. Junction penetration or spiking can be moderated or at least minimized and improved junction integrity provided by increasing the junction depth of source and drain regions 8 and 9 or by providing a thinner refractory metal layer, thereby reducing silicon consumption during silicidation. However, neither of these alternatives is satisfactory: the former approach runs counter to the trend toward smaller device dimensions, both vertically and laterally, in order to increase transistor switching speeds, and the latter approach results in an increase in metal silicide sheet resistance attendant its decrease in thickness.

Another drawback associated with the conventional processing methodology is poor quality metal silicide formation arising from the anisotropic plasma etching of the blanket insulative layer 7 utilized for forming the sidwall spacers 7', 7'. As indicated supra, according to conventional processing methodology, the plasma etching process is terminated only when the selected portions of the blanket insulative layer 7 and/or any underlying gate insulator (i.e., oxide) layer 5 are completely removed, i.e., the oxide spacer etch stops at the substrate surface, typically of silicon. However, the conventionally utilized anisotropic plasma etch processing employing fluorocarbon and/or fluorohydrocarbon gas(es) disadvantageously results in formation of a carbonaceous polymeric residue on the silicon substrate surface and/or structural damage thereto, either of which results in poor quality metal silicide formation during subsequent processing.

A number of techniques for reducing leakage in ultra-shallow junctions employed in MOSFET type semiconductor devices have been proposed, such as are disclosed in U.S. Pat. Nos. 4,835,112; 5,208,472; 5,536,684; and 5,691,212. Such techniques, however, materially add to process complexity and include such steps as germanium implantation to retard dopant diffusion, provision of multiple dielectrics at the edges of the gate electrode, formation of a $CoSi_2$—$TiN_x$ bi-layer followed by removal of the $TiN_x$ layer and ion implantation of the remaining $CoSi_2$ layer, and formation of an amorphous silicon layer on a silicon MOS precursor and subsequent implantation, oxidation, annealing, etc., steps.

Thus, there exists a need for a simplified methodology for forming self-aligned silicide (i.e., salicide) contacts to ultra-thin transistor source and drain regions which provide low contact sheet resistance, absence of spiking, no or at least minimal junction leakage, and easy compatability with conventional process flow for the manufacture of MOS-based semiconductor devices, e.g., CMOS devices. Moreover, there exists a need for an improved process for fabricating high quality, low junction leakage MOS transistor-based devices which provides increased manufacturing throughput and product yield.

DISCLOSURE OF THE INVENTION

An advantage of the present invention is a method of manufacturing a high density, sub-micron dimensioned integrated semiconductor device with an improved self-aligned contact structure.

Another advantage of the present invention is a method of forming MOS-based semiconductor devices and transistors with metal silicide-contacted shallow source and drain regions exhibiting very low junction leakage.

Still another advantage of the present invention is an improved method for forming refractory metal silicide electrical contacts to silicon semiconductor surfaces.

Yet another advantage of the present invention is a MOS transistor having very low sheet resistance self-aligned metal silicide contacts an ultra-shallow source and drain junction regions with very low junction leakage.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to an aspect of the present invention, the foregoing and other advantages are achieved in part by a method of manufacturing a semiconductor device, which method comprises the sequential steps of:

(a) providing a semiconductor substrate of a first conductivity type and having a surface;

(b) forming a thin gate insulator layer in contact with the substrate surface;

(c) forming a gate electrode on a portion of the gate insulator layer, the gate electrode comprising first and second opposing side surfaces and a top surface;

(d) forming a blanket layer of an insulative material on exposed portions of the thin gate insulator layer on the substrate surface and on the first and second opposing side surfaces and the top surface of the gate electrode;

(e) selectively removing, by anisotropically etching for a preselected interval, a major amount of the thickness of the blanket layer of insulative material from the substrate surface portions and from the top surface of the gate electrode, thereby (1) forming a tapered width insulative sidewall spacer on each of the first and second opposing side surfaces of the gate electrode and (2) leaving a residual thickness of the layer of insulative material on portions of the substrate surface adjacent to sidewall spacers and on the top surface of the gate electrode;

(f) introducing dopant impurities of a second, opposite conductivity type into the residual thickness portions of a layer of insulative material on the portions of the substrate surface adjacent the sidewall spacers to thereby form a pair of spaced-apart, shallow depth, source/drain regions in the substrate, each of the pair of source and drain regions extending to just beneath a respective proximal edge of the gate electrode; and (g) removing the residual thickness portions of the layer of insulative material to expose substantially undamaged portions of the substrate surface adjacent the sidewall spacers and to expose the top surface of the gate electrode.

In embodiments according to the present invention, step (a) comprises providing a silicon substrate; step (b) comprises forming a silicon oxide gate insulating layer about 25–50 Å thick; step (c) comprises forming the gate electrode from an electrically conductive material comprising heavily-doped polysilicon; step (d) comprises forming a blanket layer of an insulative material comprising an oxide, nitride, or oxynitride of silicon of a preselected thickness for forming the sidewall spacers with a preselected width; step (e) comprises anisotropically etching the blanket layer of insulating material for a preselected interval in a reactive plasma comprising a fluorocarbon or fluorohydrocarbon compound selected from $CF_4$ and $CHF_3$; and step (f) comprises selectively implanting the first conductivity type substrate with dopant impurity-containing ions of second type.

According to embodiments of the present invention, step (d) comprises forming a blanket, i.e., conformal, layer of insulative material comprising a layer of silicon oxide; step (e) comprises leaving a residual thickness of the silicon oxide layer on the substrate surface portions adjacent the sidewall spacers and on the top surface of the gate electrode; step (f) comprises selectively implanting an n-type silicon substrate with boron-containing p-type dopant impurities or selectively implanting a p-type silicon substrate with phosphorus- or arsenic-containing n-type dopant impurities: and step (g) comprises removing the residual silicon oxide layer portions by etching treatment with dilute aqueous HF.

According to a further embodiment of the present invention, the method further comprises the steps of:

(h) forming a blanket layer of a metal in contact with the exposed portions of the substrate surface adjacent the sidewall spacers, the top surface of the gate electrode, and the sidewall spacers;

(i) reacting the blanket metal layer to selectively form an electrically conductive silicide of the metal in contact with the portions of the silicon substrate surface adjacent the sidewall spacers and the top surface of the polysilicon gate electrode; and (j) selectively removing unreacted portions of the blanket metal layer, including portions in contact with the sidewall spacers.

According to embodiments of the present invention, step (h) comprises forming the blanket metal layer from a refractory metal selected from the group consisting of platinum, titanium, cobalt, and nickel; and step (i) comprises thermally reacting the refractory metal layer with underlying silicon of the substrate.

According to another aspect of the present invention, a method of manufacturing an MOS semiconductor device comprises the sequential steps of:

(a) providing a silicon semiconductor substrate of first conductivity type and having a surface;

(b) forming a thin silicon oxide gate insulator layer in contact with the substrate surface;

(c) forming a gate electrode comprising heavily-doped polysilicon on a portion of the gate insulator layer, the gate electrode comprising first and second opposing side surfaces and a top surface;

(d) forming a blanket layer of an insulative material comprising an oxide, nitride, or oxynitride of silicon on exposed portions of the thin gate insulator layer on the substrate and on the first and second opposing side surfaces and the top surface of the gate electrode;

(e) selectively removing, by anisotropically etching for a preselected interval, a major amount of the thickness of the blanket layer of insulative material from the substrate surface portions and from the top surface of the gate electrode, thereby (1) forming a tapered width insulative sidewall spacer on each of the first and second opposing side surfaces of the gate electrode and (2) leaving a residual thickness of the layer of insulative material on portions of the substrate surface adjacent the sidewall spacers and on the top surface of the gate electrode;

(f) introducing dopant impurities of a second, opposite conductivity type into the residual thickness portions of the layer of insulative material on the portions of the substrate adjacent the sidewall spacers to thereby form a pair of spaced-apart, shallow depth, source/drain regions in the substrate, each of the pair of source/drain regions extending to just beneath a respective proximal edge of the gate electrode;

(g) removing the residual thickness portions of the layer of insulative material to expose substantially undamaged portions of the substrate surface adjacent the sidewall spacers and to expose the top surface of the gate electrode;

(h) forming a blanket layer of a metal in contact with the exposed portions of the substrate surface adjacent the sidewall spacers, the top surface of the gate electrode, and the sidewall spacers;

(i) reacting the blanket metal layer to selectively form an electrically conductive silicide of the metal at portions thereof in contact with the exposed portions of the silicon substrate surface adjacent the sidewall spacers and the top surface of the polysilicon gate electrode; and (j) selectively removing unreacted portions of the blanket metal layer, including portions in contact with the sidewall spacers.

In embodiments according to the present invention, step (e) comprises anisotropically etching the blanket layer of insulative material for a preselected interval in a reactive plasma comprising a fluorocarbon or a fluorohydrocarbon compound selected from $CF_4$ and $CHF_3$; step (f) comprises selectively implanting the first conductivity silicon substrate with dopant impurity-containing ions of second conductivity type; step (h) comprises forming the blanket metal layer from a refractory metal selected from platinum, titanium, cobalt, and nickel; and step (i) comprises thermally reacting the blanket metal layer with underlying silicon and/or polysilicon.

According to further embodiments of the present invention, step (d) comprises forming a blanket layer of an insulative material comprising a layer of silicon oxide; step (e) comprises leaving a residual thickness of the silicon oxide layer on the portions of the substrate surface adjacent the sidewall spacers and on the top surface of the gate electrode: and step (g) comprises removing the residual silicon oxide layer portions by etching treatment with dilute aqueous HF.

According to yet another aspect of the present invention, silicon-based MOS-type transistor devices formed by the method of the above-enumerated steps (a)–(i) are provided.

Additional advantages and aspects of the present invention will become readily apparent to those skilled in the art from the following detailed description, wherein only the preferred embodiment of the present invention is shown and described, simply by way of illustration of the best mode contemplated for carrying out the method of the present invention. As will be described, the present invention is capable of other and different embodiments, and its several details are susceptible of modification in various obvious respects, all without departing from the spirit of the present invention. Accordingly, the drawing and description are to be regarded as illustrative in nature, and not as limitative.

BRIEF DESCRIPTION OF THE DRAWINGS

The following detailed description of the embodiment of the present invention can best be understood when read in conjunction with the following drawings, in which like reference numerals are employed throughout to designate similar features, wherein.

DESCRIPTION OF THE INVENTION

Figure 1A:
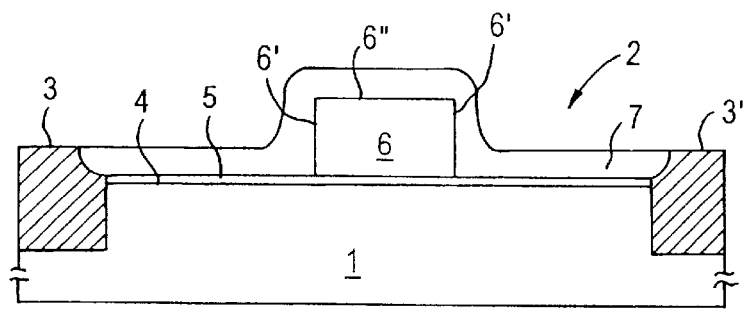
FIGS. 1(A)–1(E) illustrate, in simplified, cross-sectional schematic form, a sequence of steps for forming MOS type transistors utilizing salicide technology according to conventional practices.

The present invention addresses and solves problems arising from manufacturing submicron-dimensioned, ultra-shallow junction MOS and CMOS transistors suitable for use in high-density integration semiconductor devices, wherein, as part of the fabrication methodology, insulative sidewall spacers are formed by selective anisotropic etching of a blanket insulator layer, which sidewall spacers act as at least part of an implantation mask during formation of shallow depth, moderately- to heavily-doped source/drain junction regions to which electrical contact is made by use of salicide technology. More specifically, the present invention advantageously provides a significant and substantial reduction in the amount and severity of spiking resulting from junction penetration during silicidation reaction performed as part of the salicide processing, which spiking deleteriously affects junction quality, typically manifested as increased junction leakage current. Moreover, the inventive methodology provides increased device reliability while decreasing product yield problems associated with the conventional technology. In addition, the inventive method is fully compatible with other aspects of existing processing methodology.

Referring now to FIGS. 2(A)—2(E), shown therein is a sequence of processing steps for performing an illustrative, but not limitative, MOS transistor embodiment of the present invention, wherein similar reference numerals are used throughout to denote similar features. As will be apparent, the inventive process may be readily adapted for use with all manner of semiconductor devices, including CMOS devices. It should also be recognized that the process steps and structures described below do not necessarily form a complete process flow for manufacturing MOS and/or CMOS transistors for use in integrated circuit (IC) devices. However, the present invention can be practiced in conjunction with conventional IC fabrication techniques and methodologies currently employed in the art, and only so much of the commonly practiced process steps are included here as are necessary for and understanding of the present invention. As used throughout the present disclosure and claims, the term "substrate" denotes a semiconductor substrate per se, an epitaxial semiconductor layer formed on a suitable semiconductor substrate, a well region formed in the surface of a semiconductor substrate, or a semiconductor layer formed on a suitable non-semiconductive substrate. Finally, the figures representing cross-sections of portions of a MOS transistor device during fabrication processing are not drawn to scale, but instead are drawn as to best illustrate the features of the present invention.

Figure 1B:
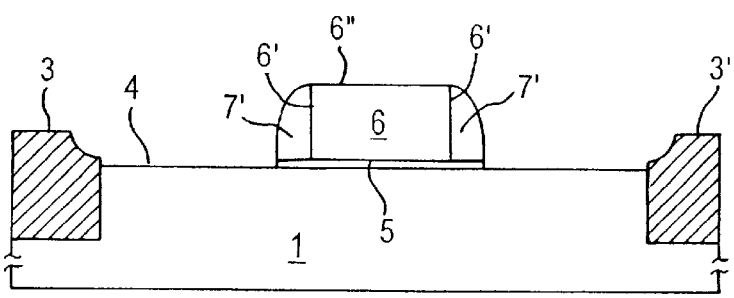
Figure 1C:
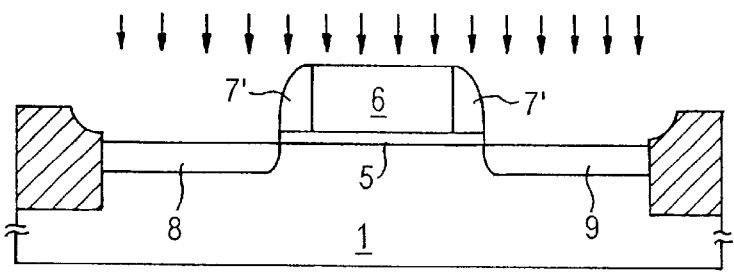
Figure 1D:
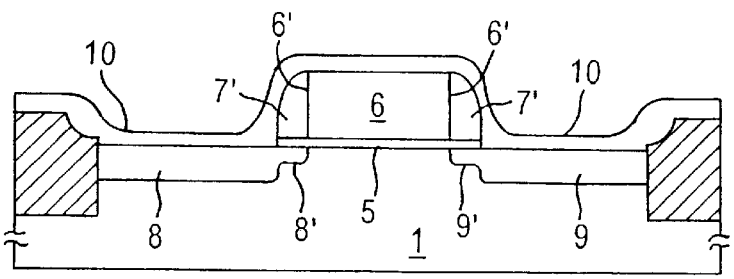
Figure 1E:
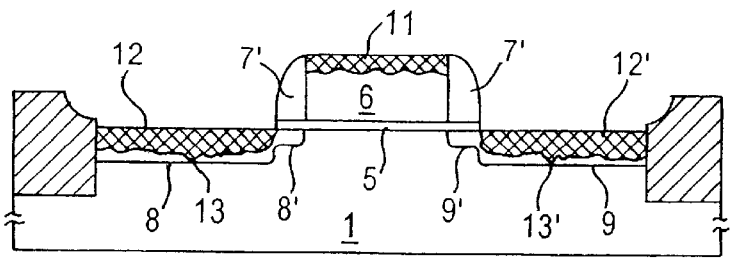

The inventive process scheme or sequence illustrated in FIGS. 2(A–2(E) is a modification of the process sequence of FIGS. 1(A)–1(E) illustrating the conventional art described supra. Accordingly, FIG. 2(A) is identical in all respect to FIG. 1(A) and shows the state of a MOS device precursor after formation of blanket insulator layer 7, prior to anisotropic etching thereof for forming sidewall spacers 7', 7'. Referring now to FIG. 2(B), in a departure from the conventional art as shown in FIG. 1(B), according to the present invention, anisotropic, selective etching of blanket insulator layer 7 is performed such that a major portion, rather than the full thickness of blanket insulator layer 7 is removed during formation of insulative sidewall spacers 7', 7'. As a consequence of the incomplete etching of blanket insulator 7, residual thickness portions 7R, 7R and 7R' are left, respectively covering the substrate surface portions adjacent the sidewall spacers 7', 7' and the top surface 6" of the gate electrode 6. As previously indicated, such anisotropic selective etching typically comprises reactive plasma etching utilizing a fluorocarbon- or fluorohydrocarbon-based plasma comprising at least one reactive, carbon-containing gaseous species, e.g., $CF_4$ and $CHF_3$. The present invention is based upon recognition that such selective anisotropic reactive plasma etching utilizing fluorocarbon- and/or fluorohydrocarbon based materials disadvantageously results in formation of a polymerized carbonaceous residue or contaminant on at least the exposed portions of the substrate surface 4 adjacent the sidewall spacers 7', 7' which are later subjected to dopant impurity implantation for forming the shallow-depth source and drain regions 8, 9. The residue disadvantageously causes uneven silicidation reaction during subsequent processing, leading to junction penetration or spiking, as illustratively indicated by reference numerals 13, 13' in FIG. 1(E). In addition, the plasma etching process can damage the surface 4 of semiconductor substrate 1, again leading to uneven silicidation reaction, spiking, junction penetration, and increased junction leakage currents.

Figure 2A:
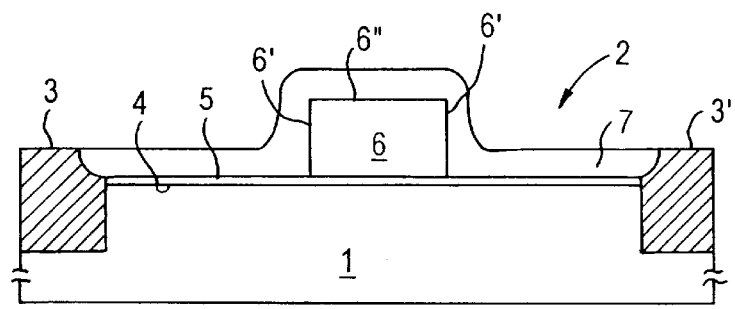
FIG. 2(A)–2(E) illustrate, in simplified, cross-sectional schematic form, a sequence of steps for forming salicide contacted, shallow-depth MOS type transistors according to the inventive methodology.
Figure 2B:
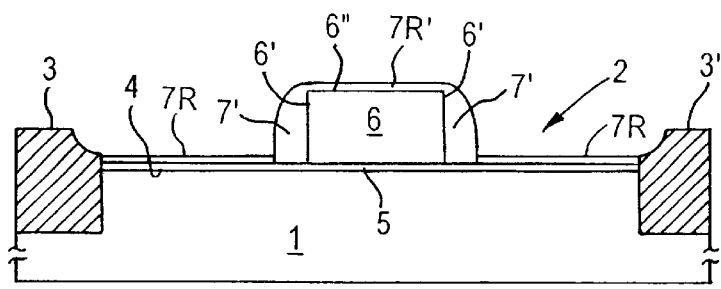

Referring still to FIG. 2(B), according to the inventive methodology and in a departure from the conventional methodology for anisotropic plasma etching of the blanket insulative layer 7 for forming sidewall spacers 7', 7', the present invention utilizes a timed etch process rather than a process relying upon an endpoint detection method for indicating complete removal of the blanket insulative layer 7 and/or underlying gate insulator 5, typically of a silicon oxide. More specifically, and by way of illustration, whereas conventional processing methodology for anisotropic reactive plasma etching of the blanket insulative layer 7 typically utilizes a spectroscopic endpoint detection technique relying upon the disappearance of a spectral peak characteristic of oxygen for indicating completion of etching of oxygen-containing insulative layers, the present method utilizes a timed etch for a predetermined time interval, based upon knowledge of the etch rate of the insulative material in a reactive plasma, which time interval is long enough to remove a major portion of the thickness of the blanket insulative layer sufficient to form the sidewall spacers 7',7' according to a desired tapered width profile, while still leaving desired residual thickness portions 7R, 7R and 7R' respectively covering, and thus protecting, the surface of source/drain implant regions 8,9 and the top surface 6" of the gate electrode 6 from contamination by carbonaceous residue or damage arising from the plasma etching. By way of illustration, but not limitation, a silicon oxide-based blanket insulative layer 7 can be removed at a suitable rate by reactive plasma etching in a $CF_4$ or $CHF_3$-based atmosphere, and etching terminated after a suitable preselected interval sufficient to leave residual thickness portions 7R and 7R', while simultaneously forming properly contoured and dimensioned sidewall spacers. Moreover, given the present disclosure and the objectives of the present invention, suitable parameters for removal of a desired major thickness portion of a selected blanket insulative layer material (as determined by conventional analytical methods not described herein for brevity) by such plasma treatment, e.g., gas pressure, power density, treatment duration, etc., may be optimized for use in particular situations.

Figure 2C:
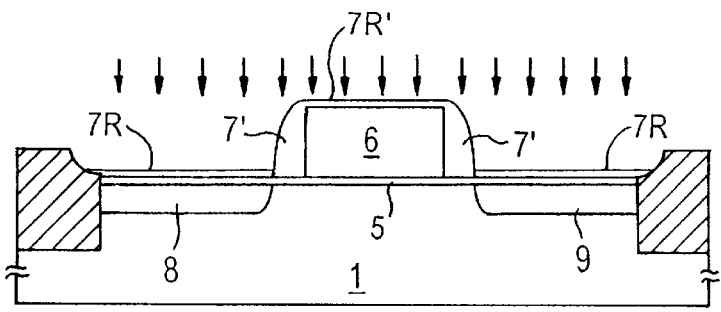

Adverting to FIG. 2(C), the structure illustrated in FIG. 2(B) and including residual thickness portions 7R for protecting substrate surface 4 from contamination and/or damage, is subjected to conventional ion implantation processing for introducing dopant impurities of opposite conductivity type, thereby forming a pair of source/drain implants 8, 9, with sidewall aspects 7, 7' acting as implantation masks and setting the lateral displacement length of the source/drain implant regions 8, 9 from the respective proximal edges 6', 6' of gate electrode 6. Implantation conditions and/or parameters are determined, in conventional fashion, based upon, inter alia, the desired device structure and function, dopant species, and substrate type. By way of illustration, but not limitation, shallow depth, moderate, to heavily-doped source/drain implants, such as may be utilized in MOS-type transistors, may be formed by implanting boron-containing p-type dopant impurities into n-type Si substrates at suitable dosages and energies, whereas phosphorus- or arsenic-containing n-type dopant impurities may be implanted into p-type Si substrate at suitable dosage and energies.

Figure 2D:
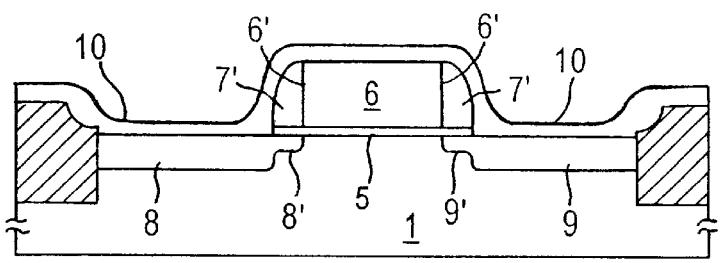

Referring now to FIG. 2(D), the thus-implanted substrate 1 comprising source/drain implants 8, 9 is then subjected to thermal processing, as by rapid thermal annealing (RTA) or furnace annealing, for effecting activation of the implanted dopant impurities and relaxation of any implantation-induced lattice damage. At the same time, shallower depth source/drain extension 8', 9' are formed which extend laterally from the respective proximal edges of the source/drain regions 8, 9 to just beneath the neighboring edge 6' of the gate electrode 6. It should be recognized, however, that the above-described method comprising forming a pair of shallow depth source/drain implants, followed by extension formation by thermal processing, represents but one example of the utility of the present invention. As should be apparent, the method of the present invention is useful in any semiconductor device processing sequence including a step of anisotropically reactive plasma etching of a blanket insulative layer for defining sidewall spacers and is of utility with a variety of source/drain formation processing conditions, including, inter alia, particular implantation conditions and post-implantation thermal processing.

Still referring to FIG. 2(D), in the next step according to the inventive methodology, the residual insulative layer portions 7R, 7R, 7R' and any underlying portions of gate insulator layer 3 (typically a silicon oxide) are removed, as by chemical etching to expose substantially undamaged portions of the silicon substrate surface overlying the source/drain implants 8, 9 and the top surface 6" of polysilicon gate electrode 6. By way of example, silicon oxide-based residual layer portions 7R, 7R, 7R' and underlying portions of silicon oxide-based gate insulator layer 5 may be removed by etching with warm, dilute aqueous HF (e.g., 1:50 $HF:H_2O$ at 25–65° C.), thereby providing clean, defect- or substantially damage-free silicon and/or polysilicon surfaces for silicidation reaction therewith.

With continued reference to FIG. 2(D), a layer 10 of a refractory metal, typically Pt, Co, Ni, or Ti, is formed, as by sputtering, to cover the clean, defect- or damage free upper surfaces of the thus-formed structure. Following refractory metal layer 10 deposition, a thermal treatment, typically RTA, is performed in conventional manner, at a temperature and for a time sufficient to convert metal layer 10 to the corresponding conductive metal silicide, e.g., $PtSi_2$, $CoSi_2$, NiSi, or $TiSi_2$. Since the refractory metal silicide forms only where metal layer 10 is in contact with underlying silicon or polysilicon, the unreacted portions of metal layer 10 formed over the silicon oxide isolation regions 3, 3' and silicon-oxide-based sidewall spacers are selectively removed, as by a wet chemical metal etch process.

Figure 2E:
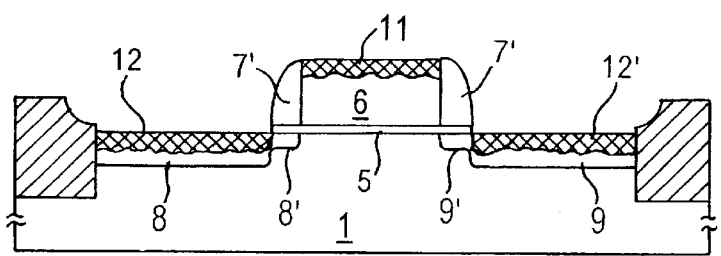

Referring now to FIG. 2(E), shown therein is the resultant structure after silicidation reaction and removal of unreacted metal portions, which structure comprises metal silicide layer portions 11 and 12, 12' respectively formed over gate electrode 6 top surface 6' and source and drain regions 8 and 9. Further processing may include, inter alia, formation of metal contact and dieletric insulator layers. As is evident from FIG. 2(E), MOS-type transistors formed according to the inventive methodology, wherein the upper surfaces of the silicon substrate where source and drain regions are present are protected during processing prior to silicide formation therewith by means of residual thickness layers of the blanket insulative material employed for sidewall spacer formation, are substantially free of the junction penetration or spiking associated with the conventional methodology, e.g., as shown at 13 and 13' in FIG. 1(E). As a consequence, MOS-type devices fabricated according to the method of the present invention exhibit reduced junction leakage currents as compared with similar devices obtained via conventional methodology.

The present invention thus enables formation of reliable, defect free, low junction leakage, shallow junction, sub-micron-dimensioned MOS transistors and CMOS devices at rates consistent with the requirements of manufacturing throughput, and is fully compatible with conventional process flow for automated manufacture of high-density integration semiconductor devices.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in order not to unnecessarily obscure the present invention.

Only the preferred embodiment of the present invention and but a few examples of it versatility are shown and described in the present disclosure. It is to be understood that the present invention is capable of use in various other combinations and environments and is susceptible of changes or modifications within the scope of the inventive concept as expressed herein.

What is claimed is:

1. A method of manufacturing a semiconductor device, which method comprises the sequential steps of:
    (a) providing a semiconductor substrate of a first conductivity type and having a surface;
    (b) forming a thin gate insulator layer in contact with said substrate surface;
    (c) forming a gate electrode on a portion of said gate insulator layer, said gate electrode comprising first and second opposing side surfaces and a top surface;
    (d) forming a blanket layer of an insulative material on exposed portions of said gate insulator layer on said substrate surface and on said first and second opposing side surfaces and said top surface of said gate electrode;
    (e) selectively removing, by anisotropically etching for a preselected interval, a major amount of the thickness of said blanket layer of insulative material from said substrate surface portions and from said top surface of said gate electrode, thereby (1) forming a tapered width insulative sidewall spacer on each of said first and second opposing side surfaces of said gate electrode and (2) leaving a residual thickness of said blanket layer of insulative material on portions of said substrate surface adjacent said sidewall spacers and on said top surface of said gate electrode;
    (f) introducing dopant impurities of a second, opposite conductivity type into said residual thickness portions of said layer of insulative material on said portions of said substrate surface adjacent said sidewall spacers to thereby form a pair of spaced-apart, shallow depth, source/drain regions in said substrate, each of said pair of source and drain regions extending to just beneath a respective proximal edge of said gate electrode; and
    (g) removing said residual thickness portions of said layer of insulative material to expose substantially undamaged portions of said substrate surface adjacent said sidewall spacers and to expose said top surface of said gate electrode.

2. The method as in claim 1, wherein:
step (a) comprises providing a silicon wafer substrate.

3. The method as in claim 2, wherein:
step (b) comprises forming a silicon oxide gate insulating layer having a thickness of about 25 to about 50 Å.

4. The method as in claim 3, wherein:
step (c) comprises forming said gate electrode from an electrically conductive material comprising heavily-doped polysilicon.

5. The method as in claim 4, wherein;
step (d) comprises forming a blanket layer of an insulative material comprising an oxide, nitride, or oxynitride of silicon of a preselected thickness for forming said insulative sidewall spacers with a preselected width.

6. The method as in claim 5, wherein:
step (e) comprises anisotropically etching said blanket layer of insulative material for a preselected interval in a reactive plasma comprising a fluorocarbon or fluorohydrocarbon compound to remove a major portion of the thickness thereof.

7. The method as in claim 6, wherein:
step (e) comprises selecting said fluorocarbon or fluorohydrocarbon compound from the group consisting of $CF_4$ and $CHF_3$.

8. The method as in claim 6, wherein:
step (d) comprises forming a blanket layer of an insulative material composing a layer of a silicon oxide; and
step (e) comprises leaving a residual thickness of said silicon oxide layer on said substrate surface portions adjacent said sidewall spacers and on said top surface of said gate electrode.

9. The method as in claim 1, wherein:
step (f) comprises selectively implanting said first conductivity type substrate with dopant impurity-containing ions of second conductivity type.

10. The method as in claim 2, wherein:
step (f) comprises selectively implanting an n-type silicon substrate with boron-containing p-type dopant impurities or selectively implanting a p-type silicon substrate with phosphorous or arsenic-containing n-type dopant impurities.

11. The method as in claim 8, wherein:
step (g) comprises removing said residual silicon oxide layer portions by etching treatment with dilute aqueous HF.

12. The method as in claim 5, further comprising the steps of:
- (h) forming a blanket layer of a metal in contact with said exposed portions of said substrate surface adjacent said sidewall spacers, said top surface of said gate electrode, and said sidewall spacers;
- (i) reacting said blanket metal layer to selectively form an electrically conductive silicide of said metal at portions thereof in contact with said exposed portions of said silicon substrate surface adjacent said sidewall spacers and said top surface of said polysilicon gate electrode; and
- (j) selectively removing unreacted portions of said blanket metal layer, including portions in contact with said sidewall spacers.

13. The method as in claim 12, wherein:
step (h) comprises forming said blanket metal layer from a refractory metal selected from the group consisting of platinum, titanium, cobalt, and nickel; and
step (i) comprises thermally reacting said refractory metal layer with underlying silicon of said substrate.

14. A method of manufacturing an MOS semiconductor device, which method comprises the sequential steps of:
- (a) providing a silicon semiconductor substrate of first conductivity type and having a surface;
- (b) forming a thin silicon oxide gate insulator layer in contact with said substrate surface;
- (c) forming a gate electrode comprising heavily-doped polysilicon on a portion of said gate insulator layer, said gate electrode comprising first and second opposing side surfaces and a top surface;
- (d) forming a blanket layer of an insulative material comprising an oxide, nitride, or an oxynitride of silicon on exposed portions of said gate insulator layer on said substrate surface and on said first and second opposing surfaces and said top surface of said gate electrode;
- (e) selectively removing, by anisotropically etching for a preselected interval, a major amount of the thickness of said blanket layer of insulative material from said substrate surface portions and from said top surface of said gate electrode, thereby (1) forming a tapered width insulative sidewall spacer on each of said first said second opposing side surfaces of said gate electrode and (2) leaving a residual thickness of said layer of insulative material on portions of said substrate surface adjacent said sidewall spacers and on said top surface of said gate electrode;
- (f) introducing dopant impurities of a second, opposite conductivity type into said residual thickness portions of said layer of insulative material on said portions of said substrate surface adjacent said sidewall spacers to thereby form a pair of spaced-apart, shallow depth, source/drain regions in said substrate, each of said pair of source/drain regions extending to just beneath a respective proximal edge of said gate electrode;
- (g) removing said residual thickness portions of said layer of insulative material to expose substantially undamaged portions of said substrate surface adjacent said sidewall spacers and to expose said top surface of said gate electrode;
- (h) forming a blanket layer of metal in contact with said exposed portions of said substrate surface adjacent said sidewall spacers, said top surface of said gate electrode, and said sidewall spacers;
- (i) reacting said blanket metal layer to selectively form an electrically conductive silicide of said metal at portions thereof in contact with said exposed portions of said silicon substrate surface adjacent said sidewall spacers and said top surface of said polysilicon gate electrode; and
- (j) selectively removing unreacted portions of said blanket metal layer, including portions in contact with said sidewall spacers.

15. The method as in claim 14, wherein:
step (e) comprises anisotropically etching said blanket layer of insulative material for a preselected interval in a reactive plasma comprising a fluorocarbon or a fluorohydrocarbon compound selected from the group consisting of $CF_4$ and $CHF_3$.

16. The method as in claim 15, wherein:
step (d) comprises forming a blanket layer of an insulative material comprising a layer of a silicon oxide; and
step (e) comprises leaving a residual thickness of said silicon oxide layer on said portions of said substrate surface adjacent said sidewall spacers and on said top surface of said gate electrode.

17. The method as in claim 16, wherein:
step (g) comprises removing said residual layer portions of silicon oxide by etching treatment with dilute aqueous HF.

18. The method as in claim 17, wherein:
step (h) comprises forming said blanket metal layer from a refractory metal selected from platinum, titanium, cobalt, and nickel; and
step (i) comprises thermally reacting said blanket metal layer with underlying silicon and/or polysilicon.

19. The method as in claim 18, wherein:
step (f) comprises selectively implanting said first conductivity type substrate with dopant impurity-containing ions of second conductivity type.

20. A silicon-based MOS transistor device formed according to the method of claim 19.

* * * * *